(12) United States Patent
Amanapu et al.

(10) Patent No.: US 10,177,030 B2
(45) Date of Patent: Jan. 8, 2019

(54) COBALT CONTACT AND INTERCONNECT STRUCTURES

(71) Applicant: International Business Machines Corporation, Armonk, NY (US)

(72) Inventors: Hari P. Amanapu, Guilderland, NY (US); Raghuveer R. Patlolla, Guilderland, NY (US); Cornelius Brown Peethala, Albany, NY (US); Chih-Chao Yang, Glenmont, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 15/403,667

(22) Filed: Jan. 11, 2017

(65) Prior Publication Data

US 2018/0197773 A1 Jul. 12, 2018

(51) Int. Cl.
 *H01L 21/76* (2006.01)
 *H01L 21/768* (2006.01)
 *H01L 23/522* (2006.01)
 *H01L 23/528* (2006.01)
 *H01L 23/532* (2006.01)

(52) U.S. Cl.
 CPC .... *H01L 21/76883* (2013.01); *H01L 21/7684* (2013.01); *H01L 21/7685* (2013.01); *H01L 21/76814* (2013.01); *H01L 21/76816* (2013.01); *H01L 21/76843* (2013.01); *H01L 21/76877* (2013.01); *H01L 21/76886* (2013.01); *H01L 23/528* (2013.01); *H01L 23/5226* (2013.01); *H01L 23/53209* (2013.01)

(58) Field of Classification Search
 CPC ......... H01L 21/76816; H01L 21/76843; H01L 21/7685; H01L 21/76877; H01L 23/5226; H01L 23/528; H01L 23/53209
 See application file for complete search history.

(56) References Cited

U.S. PATENT DOCUMENTS

| | | | |
|---|---|---|---|
| 9,330,939 B2 | 5/2016 | Zope et al. | |
| 2001/0003063 A1* | 6/2001 | Hu | H01L 21/76843 438/683 |
| 2006/0246217 A1 | 11/2006 | Weidman et al. | |
| 2015/0093891 A1 | 4/2015 | Zope et al. | |
| 2015/0147880 A1* | 5/2015 | Lee | H01L 21/76883 438/660 |
| 2015/0179579 A1* | 6/2015 | Jezewski | H01L 21/76846 257/753 |
| 2016/0056077 A1 | 2/2016 | Lai et al. | |
| 2018/0068890 A1* | 3/2018 | Zope | H01L 21/4846 |
| 2018/0151424 A1* | 5/2018 | Yao | H01L 21/76876 |

OTHER PUBLICATIONS

Hari P. Amanapu, et al., Pending U.S. Appl. No. 15/801,933, entitled "Cobalt Contact and Interconnect Structures," filed with the U.S. Patent and Trademark Office on Nov. 2, 2017.
List of IBM Patents or Patent Applications Treated As Related; (Appendix P), Date Filed Nov. 2, 2017; 2 pages.

* cited by examiner

*Primary Examiner* — Armando Rodriguez
(74) *Attorney, Agent, or Firm* — Cantor Colburn LLP; Vazken Alexanian

(57) ABSTRACT

Methods and structures for forming cobalt contact and/or cobalt interconnects includes depositing a stress control layer onto the cobalt layer prior to annealing after which the stress control layer can be removed. The stress control layer prevents formation of defects that can occur in the absence of the stress control layer.

1 Claim, 3 Drawing Sheets

US 10,177,030 B2

COBALT CONTACT AND INTERCONNECT STRUCTURES

BACKGROUND

The present invention generally relates to semiconductor integrated circuits, and more particularly, to bulk cobalt contact and interconnect structures.

Integrated circuit processing can be generally divided into front end of the line (FEOL), middle of the line (MOL) and back end of the line (BEOL) processes. The FEOL and MOL processing will generally form many layers of logical and functional devices. By way of example, the typical FEOL processes include wafer preparation, isolation, well formation, gate patterning, spacer, extension and source/drain implantation, silicide formation, and dual stress liner formation. The MOL is mainly gate contact (CA) formation. Layers of interconnections are formed above these logical and functional layers during the BEOL processing to complete the integrated circuit structure. As such, BEOL processing generally involves the formation of insulators and conductive wiring.

Cobalt is a promising fill material that can be used in FEOL, MOL, and BEOL fabrication processes for advanced semiconductor devices. For example, cobalt can be used as a PMOS fill material in a metal gate, a contact conductor fill, and as a conductor fill material for interconnects.

SUMMARY

In one or more embodiments of the present invention, a method for forming an integrated circuit includes providing a patterned substrate having a trench structure, a via structure or combinations thereof in a dielectric layer. A metal liner layer is conformally deposited onto the patterned substrate. Cobalt is deposited onto the metal liner layer. A stress control layer is deposited onto the cobalt. The patterned substrate is annealed to increase grain size of the cobalt.

In one or more embodiments of the present invention, a method for forming a contact structure and/or an interconnect structure in a semiconductor structure includes forming at least one opening extending through an interlayer dielectric. A least one opening is filled with enough cobalt to form an overburden of cobalt. A stress control layer is deposited on the overburden, wherein the stress control layer is configured to prevent diffusion of the cobalt into the stress control layer. The semiconductor structure is annealed, and the stress control layer and the overburden are removed subsequent to the annealing.

In one or more embodiments of the present invention, a semiconductor structure includes a patterned interlayer dielectric overlaying a semiconductor substrate that includes at least one opening extending through the interlayer dielectric to the semiconductor substrate. A void free cobalt metal fills the at least one opening, wherein an aspect ratio of a height and a width of the at least one opening is at least 10:1.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

Figure 1:
FIG. 1 pictorially illustrates cross-sectional micrographs before and after dynamic surface annealing of cobalt filled contacts formed in a semiconductor substrate.

The detailed description explains the preferred embodiments of the invention, together with advantages and features, by way of example with reference to the drawings.

DETAILED DESCRIPTION

Detailed embodiments of the structures of the present invention are described herein. However, it is to be understood that the embodiments described herein are merely illustrative of the structures that can be embodied in various forms. In addition, each of the examples given in connection with the various embodiments of the invention is intended to be illustrative, and not restrictive. Further, the figures are not necessarily to scale, some features can be exaggerated to show details of particular components. Therefore, specific structural and functional details described herein are not to be interpreted as limiting, but merely as a representative basis for teaching one skilled in the art to variously employ the methods and structures of the present description. For the purposes of the description hereinafter, the terms "upper", "lower", "top", "bottom", "left," and "right," and derivatives thereof shall relate to the described structures, as they are oriented in the drawing figures. The same numbers in the various figures can refer to the same structural component or part thereof.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "about," "substantially," "approximately," and variations thereof are intended to include the degree of error associated with measurement of the particular quantity based upon the equipment available at the time of filing the application. For example, "about" can include a range of ±8% or 5%, or 2% of a given value.

As used herein, the terms "invention" or "present invention" are non-limiting terms and not intended to refer to any single aspect of the particular invention but encompass all possible aspects as described in the specification and the claims.

As previously noted, cobalt is a promising fill material that can be used in FEOL, MOL, and BEOL manufacture of advanced semiconductor devices, for example, as a PMOS fill material in a metal gate, a contact conductor fill, and as a conductor fill material for interconnects. However, integrating cobalt in current device structures and processes can be difficult. One notable problem is defect formation subsequent to cobalt fill for advanced design rules during the annealing step, which is needed to form silicide regions, increase grain size, and the like. Annealing subsequent to post cobalt fill or after chemical mechanical planarizing to remove the cobalt overburden can result in void formation and/or unwanted cobalt bridging that can lead to electrical shorts and opens. For example, FIG. 1 pictorially illustrates pre-anneal and post-anneal micrographs of post cobalt filled contacts. Chemically vapor deposited (CVD) cobalt filled vias including a plasma vapor deposited (PVD) cobalt overburden were exposed to a dynamic surface anneal process to form silicide regions at the bottom of the contacts. The vias had a diameter of 20 nm and a height of 100 nm, i.e., an aspect ratio of 5:1. The vias were first lined with PVD deposited titanium at a thickness of 40 Angstroms and conformal ALD deposited titanium nitride at a thickness of 15 Angstroms. The vias were then filled with CVD cobalt at 400° C. in an argon hydrogen gas mixture. A cobalt overburden having a thickness of 500 Angstroms was PVD deposited onto the substrate. The cobalt filled vias including the cobalt overburden were then subjected to the dynamic surface annealing process, which included heating the substrate to 850° C. in a nitrogen environment with 1000 ppm oxygen. Compared to the pre-anneal cobalt filled vias, the post-anneal micrograph clearly depict various voids that are formed in the overburden. The presence of voids can result in high contact resistance, which is undesirable. Consequently, annealing subsequent to cobalt via fill is problematic and cannot be used for silicide formation and/or grain size increase.

Figure 2:
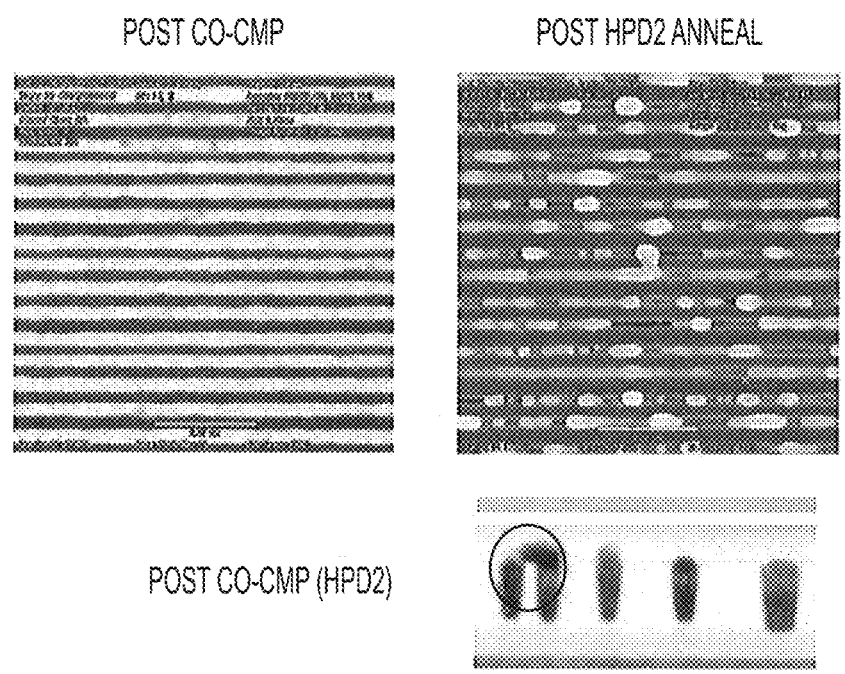
FIG. 2 pictorially illustrates top down and cross-sectional micrographs before and after high pressure deuterium annealing of cobalt filled lines formed in a semiconductor substrate after chemical mechanical polishing.

FIG. 2 depicts top-down and cross-sectional before (labeled "POST Co-CMP") and after (labeled "POST HPD2 ANNEAL" and "POST Co-CMP (HPD2)") annealing micrographs of cobalt filled vias after a chemical mechanical polishing process to remove the cobalt overburden. Annealing included subjecting the cobalt filled vias to a high pressure deuterium (HDP) annealing process typically utilized for improving the device performance. The before and after annealing micrographs clearly illustrate (e.g., at the circled region) cobalt bridges formed between adjacent lines as a result of the HDP annealing process, which is undesirable.

The present invention is generally directed to depositing a stress control layer onto the post cobalt filled vias, and if present, the cobalt overburden. The stress control layer can be deposited prior to or subsequent to chemical mechanical polishing with the proviso that the stress control layer is deposited prior to annealing. As such, the stress control layer can be directly deposited on cobalt filled vias or on the cobalt overburden. In one or more embodiments, the stress control layer is a metal or metal nitride layer that prevents cobalt diffusion therein, which can subsequently be removed by chemical mechanical polishing or by wet etching process as is generally known in the art.

Figure 3:
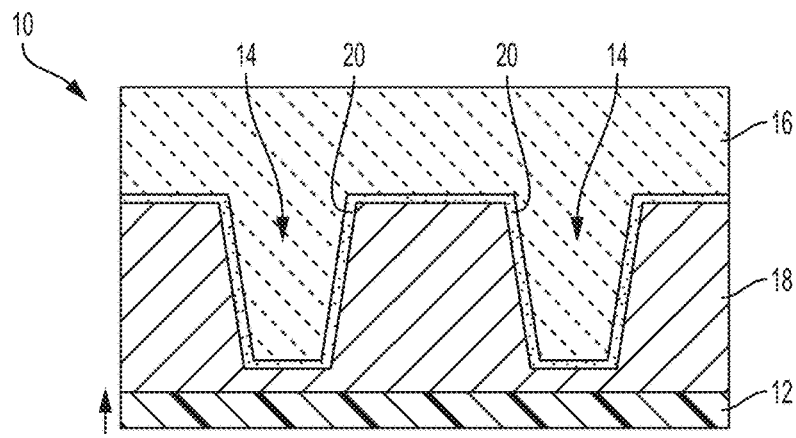
FIG. 3 depicts a cross sectional view of a cobalt filled trench/via structure formed in a dielectric layer.
Figure 4:
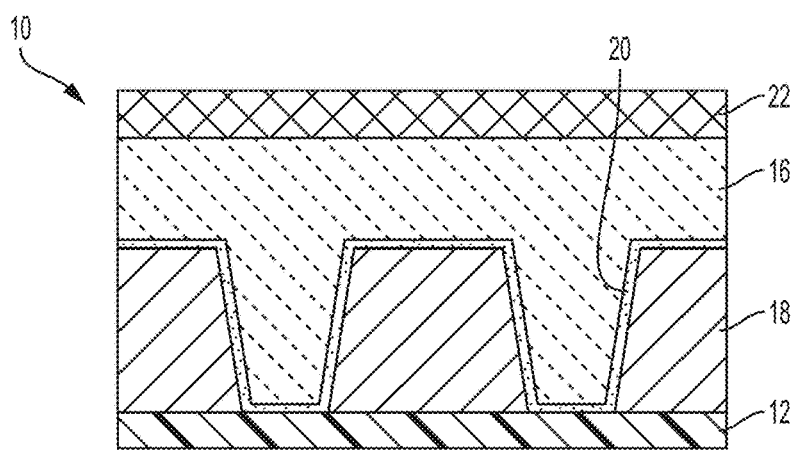
FIG. 4 depicts a cross sectional view of the cobalt filled trench/via structure of FIG. 3 subsequent to deposition of a stress control layer on the cobalt overburden followed by an annealing process.
Figure 5:
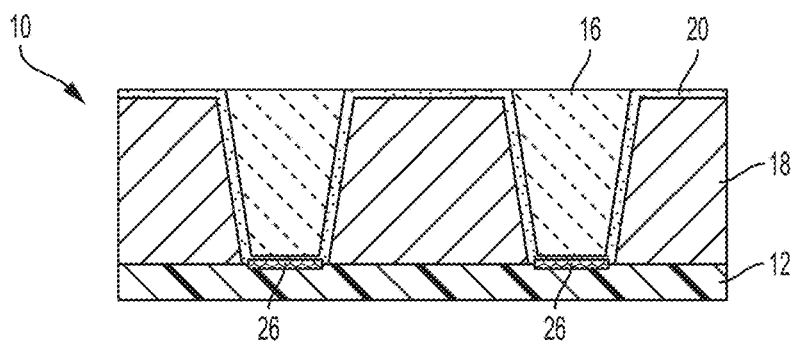
FIG. 5 depicts a cross-sectional view of the cobalt filled trench/via structure of FIG. 4 subsequent a planarization process to remove the stress control layer and the overburden.

Referring now to FIGS. 3-5, there are depicted exemplary cross-sectional views of via structures 10 formed on a substrate 12 and filled with cobalt 16 in accordance with one or more embodiments. Although reference is to vias, i.e., contacts, the use of the stress control layer as detailed herein is applicable to cobalt filled lines formed from trench features. The via structures 10 generally can have a via diameter (or trench width) of less than or equal to 2 nanometers (nm). The aspect ratio, which is herein defined as the ratio of the feature height to the diameter (or width in the case of trenches), can be greater than 5:1 in on or more embodiments, greater than 10:1 in one or more other embodiments, and greater than 20:1 in still other one or more embodiments.

As shown in FIG. 3, the via structures 10 including the cobalt fill 16 begins with forming vias 14 for interconnects and/or an open trench features for forming metal lines (not shown) in a dielectric layer 18 (e.g., an interlevel dielectric layer (ILD)) deposited on the substrate 12 and patterned through conventional lithography and anisotropic etching processes. The lithographic step generally includes applying a organic planarizing layer (OPL), silicon anti reflective coating (SiARC), and photoresist to the surface of the dielectric layer, exposing the photoresist to a desired pattern of radiation, and developing the exposed photoresist utilizing a conventional resist developer to form a pattern. The etching process can then transfer the pattern into the underlying dielectric layer. The etching process can be a dry etching process.

The term "dry etching" is used here to denote an etching technique such as plasma reactive-ion-etching (RIE), ion beam etching, plasma etching or laser ablation. RIE uses chlorine or fluorine based gases, such as $NF_3$, $CF_4$, and $CCl_4$ During the etching process, the pattern is first transferred to the dielectric layer. The patterned photoresist is typically, but not necessarily, removed from the structure after the pattern has been transferred into the dielectric film. The patterned feature formed into the dielectric material includes the contact holes and/or trenches.

The substrate 12 can be a processed wafer. A "processed wafer" is herein defined as a wafer that has undergone semiconductor front end of line processing (FEOL) or middle of the line processing (MOL), wherein the various desired devices have been formed. If the substrate 12 is a semiconductor substrate, at least one semiconductor device (not shown) such as a field effect transistor, a bipolar transistor, a diode, a capacitor, or an inductor can be formed on the substrate 10. In one or more embodiments, the substrate 12 can be a bulk semiconductor substrate or a semiconductor-on-insulator (SOT) substrate.

The dielectric layer 18 can include any dielectric including inorganic dielectrics or organic dielectrics. Some examples of suitable dielectrics that can be used as the dielectric material include, but are not limited to: silicon dioxide ($SiO_2$) deposited by CVD, high density plasma (HDP), or flowable CVD (FCVD); silsesquioxanes, carbon doped oxides (i.e., organosilicates) that include atoms of Si, C, O and H, thermosetting polyarylene ethers, or multilayers thereof. The term "polyarylene" is used to denote aryl moieties or inertly substituted aryl moieties which are linked together by bonds, fused rings, or inert linking groups such as, for example, oxygen, sulfur, sulfone, sulfoxide, carbonyl and the like. The dielectric layer 18 can be deposited by PECVD procedures as is generally known in the art. These patterned features correspond to the subsequent interconnect vias (i.e., metal plugs between levels) and can be aligned with underlying source and/or drain regions or over a metal gate structure defined by the particular substrate 10.

The via structures 10 further include a PVD deposited metal layer (example Ti) which reacts with silicon and form Ti silicide, relatively thin liner layer 20, also referred to as a barrier layer, which can be conformally deposited onto the dielectric layer 18. The liner layer is used to prevent diffusion of the cobalt into the dielectric layer 18 upon subsequent processing, which can lead to failures attributed to electromigration of the cobalt. Effective liner layers 20 can be formed from tantalum (Ta), titanium (Ti), ruthenium (Ru), iridium (Jr) tungsten (W), cobalt (Co), nitrides thereof, mixtures thereof, and the like. The liner layer 18 can be deposited through conventional deposition processes such as, for example, a plasma vapor deposition process such as R.F. sputtering, chemical vapor deposition, atomic layer deposition, and the like. In one or more embodiments, the thickness of the deposited liner layer is between about 5 Angstroms (Å) and about 40 Å. In one or more other embodiments, the thickness of the deposited liner layer is between about 10 Å and about 20 Å. In one or more other embodiments, the thickness of the deposited liner layer is less than about 15 Å.

The via structures 10 are then filled with an excess amount cobalt 16, which also forms an overburden. Filling the via structures and forming the overburden can be a multi-step process. The cobalt metal layer can be deposited by chemical vapor deposition (CVD), physical vapor deposition (PVD), electroplating techniques, and combinations thereof, wherein the materials and processes for these respective deposition processes are generally known in the art. For example, CVD and PVD deposited cobalt can be formed using a cobalt precursor as is known in the art. Suitable cobalt precursors include, but are not limited to, cobalt carbonyl complexes, cobalt amidinates compounds, cobaltocene compounds, cobalt dienyl complexes, cobalt nitrosyl complexes, derivatives thereof, complexes thereof, plasma thereof, or combinations thereof. Suitable cobalt precursors can include, but not limited to, cobalt carbonyl complexes, cobalt amidinates compounds, cobaltocene compounds, cobalt dienyl complexes, cobalt nitrosyl complexes, cobalt diazadienyl complexes, cobalt hydride complexes, derivatives thereof, complexes thereof, plasmas thereof, or combinations thereof. In one implementation, examples of the cobalt precursors that can be used herein include dicobalt hexacarbonyl butylacetylene, dicobalt hexacarbonyl methylbutylacetylene, dicobalt hexacarbonyl phenylacetylene, hexacarbonyl methylphenylacetylene, dicobalt hexacarbonyl methylacetylene, dicobalt hexacarbonyl dimethylacetylene, cobalt aminidate, cobalt hexafluoro acetylacetone, cobalt acetylacetonate, cobalt (II) acetlyacteone, cobalt acetate, derivatives thereof, complexes thereof, plasmas thereof, or combinations thereof. Other exemplary cobalt carbonyl complexes include cyclopentadienyl cobalt bis (carbonyl), tricarbonyl allyl cobalt, cobalt tricarbonyl nitrosyl, derivatives thereof, complexes thereof, plasmas thereof, or combinations thereof. In one particular example of the cobalt precursors used herein is dicobalt hexacarbonyl butylacetylene. It is noted that the precursors can be supplied into the metal deposition processing chamber with a carrier gas such as an argon gas or a reducing agent such as hydrogen (e.g., $H_2$ or atomic-H), nitrogen (e.g., $N_2$ or atomic-N), ammonia ($NH_3$), hydrazine ($N_2H_4$), a hydrogen and ammonia mixture ($H_2/NH_3$), borane ($BH_3$), diborane ($B_2H_6$), triethylborane ($Et_3B$), silane ($SiH_4$), disilane ($Si_2H_6$), trisilane ($Si_3H_8$), tetrasilane ($Si_4HiO$), methyl silane ($SiCH_6$), dimethylsilane ($SiC_2H_8$), phosphine ($PH_3$), derivatives thereof, plasmas thereof, or combinations thereof. By way of example, the vias can be filled utilized chemical vapor deposition and the cobalt overburden can be formed using plasma enhanced chemical vapor deposition.

Referring now to FIG. 4, there is shown the via structures 10 of FIG. 3, subsequent to deposition of a stress control layer 22 onto the cobalt overburden layer. The stress control layer can be formed from tantalum (Ta), titanium (Ti), ruthenium (Ru), iridium (Jr) tungsten (W), cobalt (Co), nitrides thereof, mixtures thereof, and the like. In one or more embodiments, the stress control layer 22 is formed of the same material as the liner layer 20. In one or more embodiments, the thickness of the stress control layer is generally less than 500 Angstroms, although greater thicknesses could be used. In one or more other embodiments, the thickness of the stress control layer is 50 Angstroms to 300 Angstroms, and in still other embodiments, the thickness of the stress control layer is 50 to 150 Angstroms. The stress control layer can be deposited by methods well known in the art, such as chemical vapor deposition (CVD) or physical vapor deposition (PVD).

Subsequent to deposition of the stress control layer 22, the via structure is subjected to an annealing process. The annealing process can be performed using a rapid thermal processing system such as those manufactured by AG Associates or Applied Materials. Alternatively, a conventional furnace can be used. Furthermore, the anneal process can be performed at a temperature less than the thermal budget of the backend structures. For example, in one or more embodiments, the anneal process is performed at a temperature of room temperature to 300° C., 400° C., 500° C. or more. For example, the via structure can be subjected to a rapid thermal annealing process at temperatures of about 200° C. to about 400° C. for a period of time of about 30 minutes to about 4 hours so as to increase cobalt grain size, and optionally, form silicide regions at the interface between the bottom of the via and the substrate as can be desired for some applications. In one or more embodiments, the anneal process is performed at a temperature that is higher than the melting point of fill material but lower than the thermal budget of the backend structures. In one or more embodiments, the anneal temperature is not higher than the melting point of the material being annealed as reflow of materials to be annealed can happen at much lower temperatures than the melting point for the material to be annealed. In such embodiments anneal temperatures for the material to be annealed can be less than the thermal budget of backend structures.

Referring now to FIG. 5, subsequent to annealing, the stress control layer 22 and the overburden are removed. In one or more embodiments, both the stress control layer 22 and the overburden are removed by a planarization process such as chemical mechanical planarization (CMP) process. The CMP process planarizes the surface of the interconnect structure by a combination of chemical and mechanical forces generally known in the art. In one or more embodiments, the CMP process can be a timed CMP process that is timed to stop at the top surface of the dielectric layer. In one or more other embodiments, the CMP process can utilize the top surface of the line dielectric layer as a stopping layer. Because the thickness of the cobalt overburden deposited above the top surface of the dielectric layer can vary, utilizing the top surface as a stopping layer can be a more reliable method. In an alternative embodiment, an etch process is used to remove the stress control layer and the cobalt overburden disposed above the top surface of the dielectric layer.

In one or more other embodiments, the stress control layer can first be removed by wet etching followed by removal of the overburden by a planarization process such as CMP. The wet etching chemistry can be selective to the cobalt and dielectric surface and is not intended to be limited. Exemplary wet etchant chemistries are typically tailored to the specific composition of the stress control layer. By way of example, wet etch removal can include applying a mixture of ammonium hydroxide, an azole type compound such as benzotriazole with hydrogen peroxide, which is also known as APM or SC-1, a mixture of hydrogen peroxide, organic onium hydroxide compound and an acid in a known manner. Typical APM solutions include, for example, a ratio of $NH_4OH:H_2O_2:H_2O=1:1:5$. Typical SPM solutions include, for example, a ratio of $H_2SO_4:H_2O_2=1:5$. The substrate is exposed to the wet etchant for a period of time (typically, about 0.5 minutes to about 5 minutes) and at a temperature (about 25° C. to about 70° C.) effective to etch the titanium nitride selectively relative to the surrounding structures, e.g., the copper alloy and dielectric surfaces.

Figure 6:
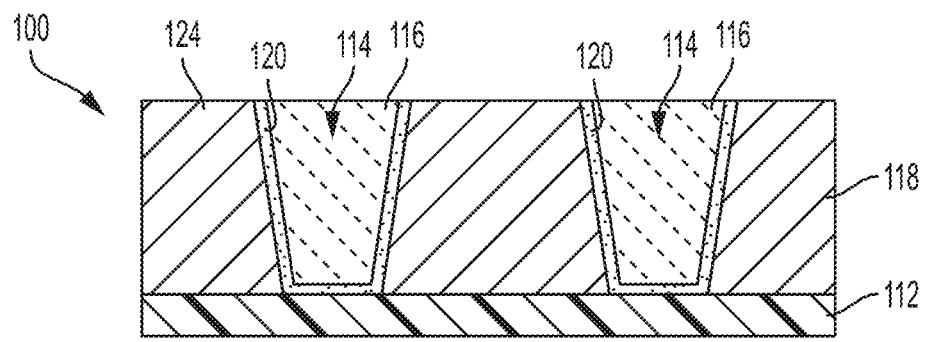
FIG. 6 depicts a cross-sectional view of a cobalt filled via structure formed in a dielectric layer subsequent to chemical mechanical polishing to remove a cobalt overburden.
Figure 7:
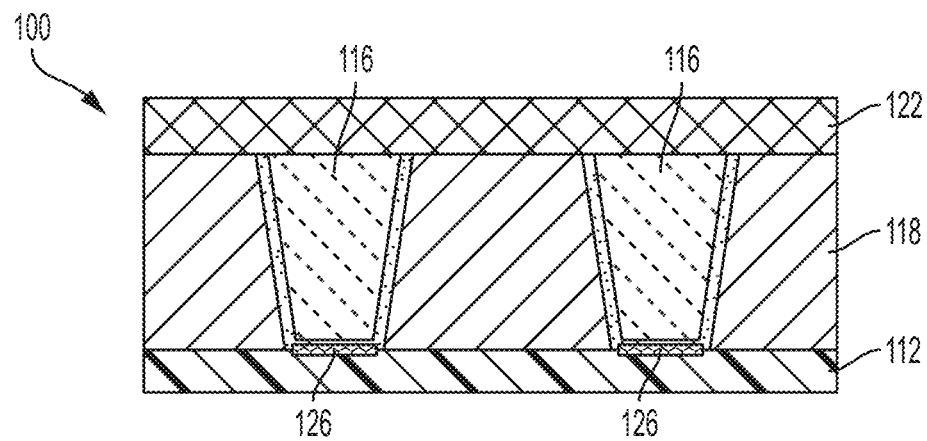
FIG. 7 depicts a cross-sectional view of the cobalt filled via structure of FIG. 6 subsequent to deposition of a stress control layer on the cobalt overburden followed by an annealing process.

Referring now to FIGS. 6-7, there is shown via structures 100 filled with cobalt and subjected to a CMP. In FIG. 6, the via structure 100 include vias 120 formed in a dielectric layer 118 overlaying a substrate 112. The vias include a liner layer 114 as previously described. The CMP process provides a planarized surface 124 by removing the overburden.

Referring now to FIG. 7, a stress control layer 122 is blanket deposited onto the planarized surface and overlays the cobalt filled vias. As previously discussed, the stress control layer can be formed from tantalum (Ta), titanium (Ti), ruthenium (Ru), iridium (Jr) tungsten (W), cobalt (Co), nitrides thereof, mixtures thereof, and the like, which can be deposited through conventional deposition processes such as, for example, a plasma vapor deposition process such as R.F. sputtering, chemical vapor deposition, atomic layer deposition, and the like.

Subsequent to deposition of the stress control layer 122, an annealing process as previously discussed is applied, which increases grain size and can be used to form silicide regions 126.

Referring now to FIG. 7, the stress control layer 22 is then removed. In one or more embodiments, the stress control layer can be removed by a planarization process such as chemical mechanical planarization (CMP) process as previously described. In one or more other embodiments, the stress control layer can be removed by wet etching such as previously described.

While the present invention has been described in terms of specific embodiments, it is evident in view of the foregoing description that numerous alternatives, modifications and variations will be apparent to those skilled in the art. Each of the various embodiments of the present invention can be implemented alone, or in combination with any other embodiments of the present invention unless expressly described otherwise or otherwise impossible as would be known to one of ordinary skill in the art. Accordingly, the present invention is intended to encompass all such alternatives, modifications and variations which fall within the scope and spirit of the present invention and the following claims.

What is claimed is:

1. An intermediate semiconductor structure, comprising:
    a patterned interlayer dielectric overlaying a semiconductor substrate, wherein the patterned interlayer dielectric comprises at least one opening extending through the interlayer dielectric to the semiconductor substrate;
    a cobalt metal filling the at least one opening; and
    a stress control layer on top of the cobalt metal filling, wherein the cobalt metal filling is substantially void free subsequent to an annealing process with the stress control layer on top of the cobalt metal filling
    wherein an aspect ratio of a height and a width of the at least one opening is at least about 10:1.

* * * * *